United States Patent
Liu et al.

(10) Patent No.: US 10,985,195 B2
(45) Date of Patent: Apr. 20, 2021

(54) ARRAY SUBSTRATES AND METHODS FOR MANUFACTURING THEREOF AND DISPLAY SCREENS

(71) Applicant: Kunshan Go-Visionox Opto-Electronics Co., Ltd., Kunshan (CN)

(72) Inventors: Mingxing Liu, Kunshan (CN); Deqiang Zhang, Kunshan (CN); Dongyun Lv, Kunshan (CN); Xuliang Wang, Kunshan (CN); Shuaiyan Gan, Kunshan (CN); Feng Gao, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 0 days.

(21) Appl. No.: 16/513,734

(22) Filed: Jul. 17, 2019

(65) Prior Publication Data

US 2019/0341406 A1    Nov. 7, 2019

Related U.S. Application Data

(63) Continuation of application No. PCT/CN2018/091860, filed on Jun. 19, 2018.

(30) Foreign Application Priority Data

Nov. 30, 2017    (CN) .......................... 201711241852.X

(51) Int. Cl.
*H01L 27/12*    (2006.01)

(52) U.S. Cl.
CPC ........ *H01L 27/1244* (2013.01); *H01L 27/127* (2013.01); *H01L 27/1218* (2013.01); *H01L 27/1259* (2013.01); *H01L 27/1262* (2013.01)

(58) Field of Classification Search
CPC .............. H01L 27/1244; H01L 27/127; H01L 27/1262; H01L 27/1218; H01L 27/1259
See application file for complete search history.

(56) References Cited

U.S. PATENT DOCUMENTS

| | | | |
|---|---|---|---|
| 9,699,898 | B2 | 7/2017 | Bae et al. |
| 2008/0224599 | A1* | 9/2008 | Kim .................... H01L 27/3276 313/504 |

(Continued)

FOREIGN PATENT DOCUMENTS

| CN | 101078826 A | 11/2007 |
|---|---|---|
| CN | 204302629 U | 4/2015 |

(Continued)

OTHER PUBLICATIONS

CN First Office Action dated Nov. 9, 2018 in the corresponding CN application(application No. 201711241852.X).

*Primary Examiner* — Ahmed N Sefer
(74) *Attorney, Agent, or Firm* — Kilpatrick Townsend & Stockton

(57) ABSTRACT

The present disclosure relates to an array substrate. The array substrate includes an active area; and a non-active area located outside the active area. The non-active area includes a flexible substrate having a surface provided with a number of grooves, and a peripheral metal wiring located in the number of grooves.

14 Claims, 4 Drawing Sheets

(56) References Cited

U.S. PATENT DOCUMENTS

| | | | | |
|---|---|---|---|---|
| 2012/0291275 | A1* | 11/2012 | Rha | H05K 3/107 |
| | | | | 29/846 |
| 2013/0026476 | A1* | 1/2013 | Park | H01L 27/3276 |
| | | | | 257/59 |
| 2014/0217397 | A1* | 8/2014 | Kwak | H01L 27/1218 |
| | | | | 257/43 |
| 2016/0103532 | A1* | 4/2016 | Jaw | H05K 3/188 |
| | | | | 345/173 |
| 2016/0204051 | A1* | 7/2016 | Cheng | H01L 24/09 |
| | | | | 257/738 |
| 2017/0042047 | A1* | 2/2017 | Oh | G02F 1/133305 |
| 2017/0243525 | A1* | 8/2017 | Morikawa | H05B 33/04 |
| 2018/0348918 | A1* | 12/2018 | Rhe | H01L 27/323 |
| 2019/0333940 | A1* | 10/2019 | Zeng | H01L 27/3258 |
| 2019/0341402 | A1* | 11/2019 | Li | H01L 51/56 |

FOREIGN PATENT DOCUMENTS

| | | |
|---|---|---|
| CN | 105144418 A | 12/2015 |
| CN | 105612589 A | 5/2016 |
| CN | 106252380 A | 12/2016 |
| CN | 106876259 A | 6/2017 |
| CN | 206685061 U | 11/2017 |
| CN | 107910336 A | 4/2018 |
| CN | 207517287 U | 6/2018 |

\* cited by examiner

ARRAY SUBSTRATES AND METHODS FOR MANUFACTURING THEREOF AND DISPLAY SCREENS

CROSS-REFERENCES TO RELATED APPLICATIONS

This application is a continuation application of International Application No. PCT/CN2018/091860, filed on Jun. 19, 2018, which claims the priority benefit of Chinese Patent Application No. 201711241852. X, titled "ARRAY SUBSTRATE, METHOD FOR MANUFACTURING THE SAME AND DISPLAY SCREEN" and filed on Nov. 30, 2017. The entireties of both applications are incorporated by reference herein for all purposes.

TECHNICAL FIELD

The present disclosure relates to the field of display technologies.

BACKGROUND

A display screen may include an active area (AA) and a non-active area (non-AA). In order to realize certain functions, the non-active area is required to be bendable. For example, in order to realize a narrow bezel, the non-active area is bent to the back of the screen to reduce the width of the bezel.

SUMMARY

In view of above, it is desirable to provide an array substrate capable of preventing breakage of the peripheral metal wiring effectively.

Provided is an array substrate, including an active area, and a non-active area located outside the active area. The non-active area includes: a flexible substrate having a surface provided with a plurality of grooves; and a peripheral metal wiring located in the grooves.

According to the array substrate, the surface of the flexible substrate is provided with the grooves and the peripheral metal wiring is located in the grooves, such that a thickness of the flexible substrate at the peripheral metal wiring is thinned to reduce squeezing of the peripheral metal wiring by the flexible substrate during a bending process. Moreover, the configuration of the grooves can also effectively release stress of the flexible substrate during bending, thereby effectively preventing breakage of the peripheral metal wiring, to improve reliability of the array substrate.

In an embodiment, depths of the plurality of grooves are not exactly the same.

In an embodiment, the non-active area further includes an encapsulation layer formed on a surface of the flexible substrate proximate to the peripheral metal wiring.

In an embodiment, the non-active area further includes a stress buffer layer formed between bottom walls of the plurality of grooves and the peripheral metal wiring.

In an embodiment, the stress buffer layer is provided with a plurality of through holes or blind holes.

In an embodiment, a width of the peripheral metal wiring is less than a width of the groove, and the peripheral metal wiring is located at an intermediate position of the groove. The non-active area further includes a buffer strip formed in the groove, and the buffer strip fills space on both sides of the peripheral metal wiring in the groove.

In an embodiment, the flexible substrate includes a flexible substrate main layer, and a flexible substrate surface layer formed on a surface of the flexible substrate main layer proximate to the peripheral metal wiring.

In an embodiment, the flexible substrate main layer includes at least one flexible substrate layer, and the flexible substrate surface layer includes at least one flexible substrate layer.

In an embodiment, the flexible substrate surface layer is a patterned flexible substrate surface layer, and hollow regions of the flexible substrate surface layer and the flexible substrate main layer. form the grooves In an embodiment, a thickness of the flexible substrate surface layer is equal to a depth of the groove.

In an embodiment, the plurality of grooves is arranged in a grid shape.

The present disclosure further provides a display screen. The display screen includes the array substrate provided by the present disclosure.

Since the display screen includes the array substrate provided by the present disclosure, the structure of the non-active area of the array substrate can prevent breakage of the peripheral metal wiring effectively, thereby better guaranteeing transmission of signals and extending a service life of the display screen.

The present disclosure further provides a method for manufacturing an array substrate.

Provided is a method for manufacturing an array substrate. The array substrate includes an active area and a non-active area. The method includes manufacturing the non-active area of the array substrate, which includes: providing a flexible substrate; forming a plurality of grooves on a surface of the flexible substrate; and forming peripheral metal wiring in the plurality of grooves.

In an embodiment, the forming the plurality of grooves on the surface of the flexible substrate includes: providing a flexible substrate main layer; and forming a patterned flexible substrate surface layer on the flexible substrate main layer, such that hollow regions of the flexible substrate surface layer and the flexible substrate main layer form the plurality of grooves.

In an embodiment, the forming the patterned flexible substrate surface layer on the flexible substrate main layer includes forming the patterned flexible substrate surface layer on the flexible substrate main layer by means of a mask.

In an embodiment, after the forming the plurality of grooves on the surface of the flexible substrate and before the forming the peripheral metal wiring in the plurality of grooves, the method further includes: forming a stress buffer layer on bottom walls of the plurality of grooves.

In an embodiment, after the forming the peripheral metal wiring in the plurality of grooves, the method further includes: forming a buffer strip on both sides of the peripheral metal wiring in the grooves.

According to the array substrate manufactured by the above method, on one hand, the groove causes the thickness of the flexible substrate at the peripheral metal wiring to be thinned, so as to reduce the squeezing of the peripheral metal wiring by the flexible substrate during a bending process. On the other hand, the configuration of the groove can also release the stress of the flexible substrate during bending, thereby effectively preventing breakage of the peripheral metal wiring.

DETAILED DESCRIPTION OF THE INVENTION

For a conventional display screen, the peripheral metal wiring within the non-active area is easy to be broken during bending, thereby resulting in a defective screen. It is desirable to provide an array substrate capable of preventing breakage of the peripheral metal wiring effectively.

In order to make the objects, technical solutions and advantages of the present disclosure more comprehensible, the present disclosure will be described in detail below with reference to the accompanying drawings and embodiments.

Figure 1:
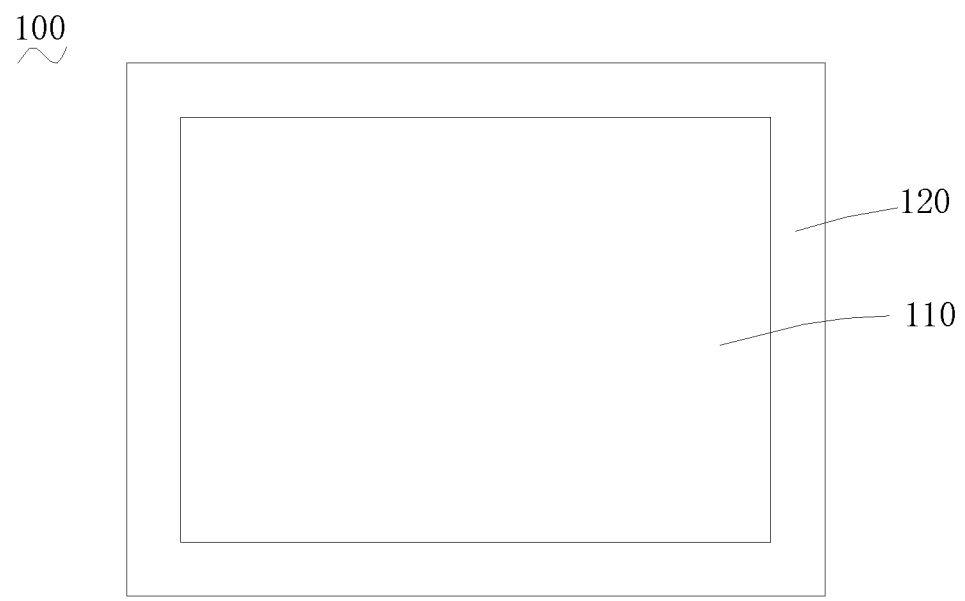
FIG. 1 is a schematic cross sectional view of an array substrate according to Embodiment One of the present disclosure.
Figure 2:
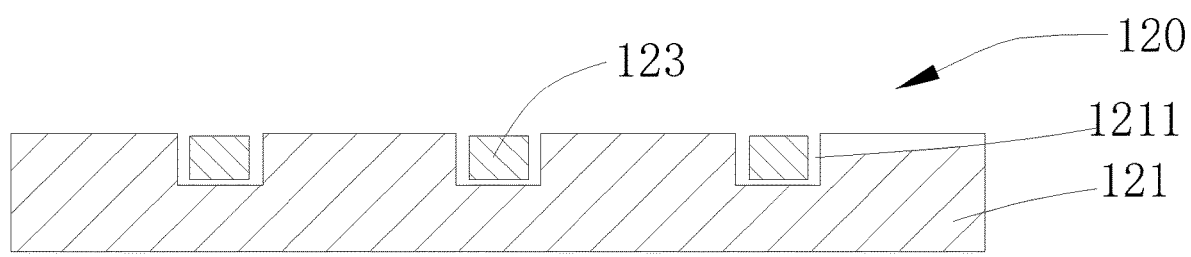
FIG. 2 is a schematic cross sectional view of the array substrate in FIG. 1.
Figure 3:
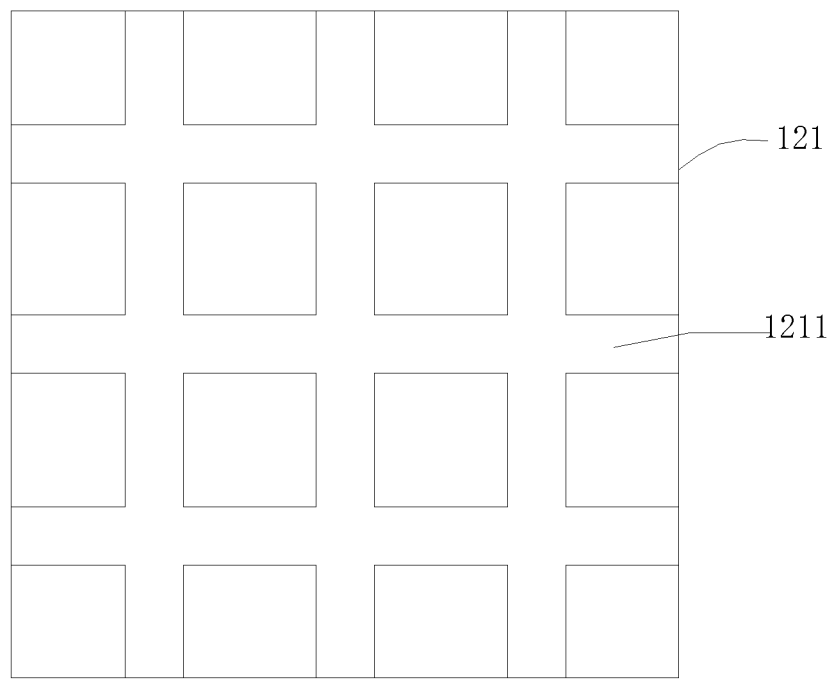
FIG. 3 is a top view of the array substrate in FIG. 1.

As shown in FIGS. 1-3, Embodiment One of the present disclosure provides an array substrate 100 including an active area 110 and a non-active area 120 located outside the active area.

The active area (i.e. AA) 110 is an area of the array substrate 100 corresponding to pixel units. Electronic components for driving the pixel units such as thin-film transistors, capacitors or the like are arranged within the active area 110. The present disclosure has no special restriction on the specific configuration of the active area 110, and various configurations that are considered proper by those skilled in the art may be employed, and are not described herein.

The non-active area (i.e. non-AA) 120 surrounds the active area 110. The non-active area 120 may be arranged on an outer side of any one or more side edges of the active area 110.

The non-active area 120 includes a flexible substrate 121 and a peripheral metal wiring 123. Specifically, a surface of the flexible substrate 121 is provided with a plurality of grooves 1211, and the peripheral metal wiring 123 is located in the grooves 1211.

In this embodiment, the flexible substrate 121 includes a flexible substrate layer. The flexible substrate 121 may include a plurality of stacked flexible substrate layers.

In this embodiment, the groove 1211 has a cross section in a shape of a rectangle. It should be noted that the cross section of the groove 1211 is not limited to the rectangle, but can also be in other regular or irregular shapes, such as a trapezoid or the like.

A thickness of the flexible substrate 121 at the peripheral metal wiring 123 is reduced, due to the grooves 1211. A squeezing force of the peripheral metal wiring 123 by the flexible substrate 121 is reduced during a bending process. Furthermore, the configuration of the groove 1211 can also release stress of the flexible substrate 121 during bending. Thereby breakage of the peripheral metal wiring 123 is effectively prevented.

It should be understood that a position of the groove 1211 is configured according to the position of the peripheral metal wiring 123. In this embodiment, the plurality of grooves 1211 is arranged in a crisscross pattern and in a grid shape.

In this embodiment, depths of the plurality of grooves 1211 are the same, and adapted to a case where a bending degree of the non-active area 120 at each position is substantially the same.

If the bending degree of the non-active area 120 at each position is different, or in a case that the breakage of the peripheral metal wiring 123 can be caused due to an angle of the metal wiring or others even if the bending degrees are the same, it is possible to change the depth of the groove 1211 to adapt to the different bending conditions, thereby avoiding the breakage of the peripheral metal wiring 123. That is, the depths of the plurality of grooves 1211 may not be exactly the same.

In another embodiment, the non-active area 120 may also include an encapsulation layer formed on a surface of the flexible substrate 131 proximate to the peripheral metal wiring.

Figure 4:
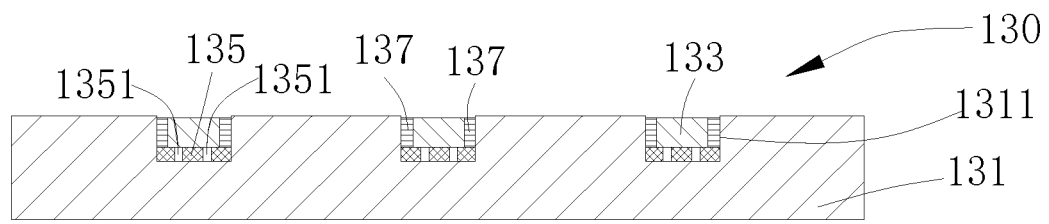
FIG. 4 is a schematic cross sectional view of a non-active area of an array substrate according to Embodiment Two of the present disclosure.

FIG. 4 is a schematic cross sectional view of a non-active area of an array substrate according to Embodiment Two of the present disclosure. Different from the array substrate 100, the non-active area 130 further includes a stress buffer layer 135 formed between bottom walls of the grooves 1311 and the peripheral metal wiring 133. The stress buffer layer 135 further mitigates the squeezing force of the peripheral metal wiring 133 by the flexible substrate 131, preventing the breakage of the peripheral metal wiring 133 more effectively. The stress buffer layer 135 can be an organic layer or other material layers functioning as stress buffer.

In this embodiment, the stress buffer layer 135 is provided with a plurality of through holes 1351. The through holes 1351 can release the stress of the stress buffer layer 135 when bending, thereby further mitigating the squeezing force of the peripheral metal wiring 133. It is also possible to arrange a plurality of blind holes in the stress buffer layer 135, which can also function as releasing the stress of the stress buffer layer 135 when bending.

Furthermore, a width of the peripheral metal wiring 133 is less than a width of the groove 1311, and the peripheral metal wiring 133 is located at an intermediate position of the groove 1311. The non-active area 130 further includes a buffer strip 137 formed in the grooves, so as to fill space on both sides of the peripheral metal wiring 133 in the groove 1311. With the configuration of the buffer strip 137, the buffer strip 137 wraps the both sides of the peripheral metal wiring 133 to mitigate the squeezing force of the both sides of the peripheral metal wiring 133 by the flexible substrate 131 effectively when bending. The buffer strip 137 may be made of an organic matter, or other materials functioning as stress buffer.

It should be noted that it is possible to provide only the stress buffer layer 135 or only the buffer strip 137 according to the bending conditions of the non-active area 130.

Figure 5:
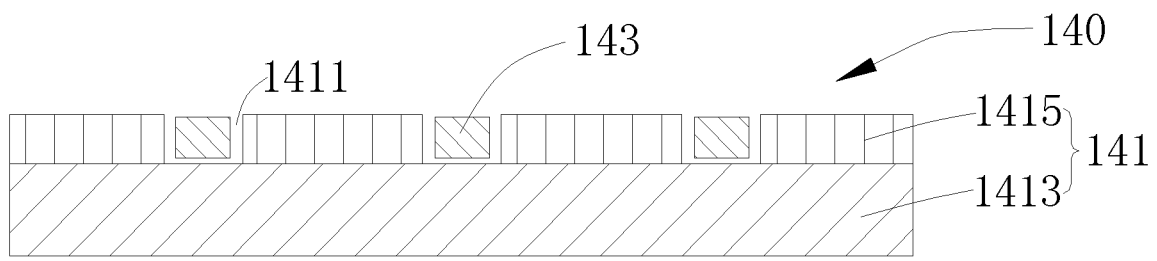
FIG. 5 is a schematic cross sectional view of a non-active area of an array substrate according to Embodiment Three of the present disclosure.

FIG. 5 is a schematic cross sectional view of a non-active area of an array substrate according to Embodiment Three of the present disclosure. Different from the array substrate 100, the flexible substrate 141 of the non-active area 140 includes a flexible substrate main layer 1413, and a flexible substrate surface layer 1415 formed on a surface of the flexible substrate main layer 1413 adjacent to the peripheral metal wiring 143.

Specifically, the flexible substrate main layer 1413 includes at least one flexible substrate layer. The flexible substrate surface layer 1415 includes at least one flexible substrate layer.

In this embodiment, a thickness of the flexible substrate surface layer 1415 is equal to a depth of the groove 1411. Specifically, a patterned flexible substrate surface layer 1415 may be formed on the surface of the flexible substrate main layer 1413 by means of a mask. Hollow regions of the flexible substrate surface layer 1415 and the flexible substrate main layer 1413 form the grooves 1411.

In this embodiment, the stress buffer layer may be formed between the bottom walls of the grooves 1411 and the peripheral metal wiring 143, to further mitigate the squeezing force of the peripheral metal wiring 143 by the flexible substrate 141 effectively, and prevent the breakage of the peripheral metal wiring 143 more effectively. It is also possible to arrange a plurality of through holes or blind holes in the stress buffer layer. Either the through holes or the blind holes can release the stress of the stress buffer layer when bending, thereby further mitigating the squeezing of the peripheral metal wiring 143, and preventing the breakage of the peripheral metal wiring 143 more effectively.

Similarly, the buffer strip may also be formed in the groove 1411 to fill the space on both sides of the peripheral metal wiring 143 in the groove 1411. With the configuration of the buffer strip, the buffer strip wraps the both sides of the peripheral metal wiring 143 to mitigate the squeezing of the both sides of the peripheral metal wiring 143 by the flexible substrate 141 effectively when bending.

The present disclosure provides a display screen including the array substrate provided by the present disclosure.

It should be noted that the display screen further includes other devices in addition to the array substrate. The specific structure of the other devices and the connection relationship between the devices can adopt well-known structures to those skilled in the art, and will not be described herein.

The structure of the non-active area of the array substrate provided by the present disclosure may prevent the breakage of the metal wiring effectively, thereby better guaranteeing transmission of signals and extending a service life of the display screen.

The present disclosure provides a method for manufacturing an array substrate. The method for manufacturing the non-active area of the array substrate includes the following steps.

Step S1, a plurality of grooves is formed on a surface of the flexible substrate.

Specifically, the grooves can be formed directly on the surface of the flexible substrate by means of etching.

In another embodiment, the flexible substrate includes a flexible substrate main layer and a flexible substrate surface layer. The flexible substrate main layer includes at least one flexible substrate layer. The flexible substrate surface layer includes at least one flexible substrate layer. The plurality of grooves formed on the surface of the flexible substrate includes: providing a flexible substrate main layer; and forming a patterned flexible substrate surface layer on the flexible substrate main layer, such that hollow regions of the flexible substrate surface layer and the flexible substrate main layer form the grooves.

Specifically, the patterned flexible substrate surface layer can be formed on the flexible substrate main layer by means of a mask.

It should be noted that if an inorganic film layer or a planarization layer or the like is formed on the flexible substrate, the inorganic film layer or the planarization layer on the flexible substrate may be removed by etching or the like before the step S1.

Step S2, a peripheral metal wiring is formed in the grooves.

It should be noted that the array substrate includes an active area and a non-active area. The method for manufacturing the active area may be a well-known manufacturing method to those skilled in the art, and will not be described herein.

According to the array substrate manufactured by the above method, on one hand, the groove causes the thickness of the flexible substrate at the peripheral metal wiring to be thinned, so as to reduce the squeezing of the peripheral metal wiring by the flexible substrate during a bending process. On the other hand, the configuration of the groove can also release the stress of the flexible substrate during bending, thereby effectively preventing the breakage of the peripheral metal wiring.

It should be understood that if the non-active area includes a stress buffer layer formed between bottom walls of the grooves and the peripheral metal wiring, the method for manufacturing the non-display area of the array substrate further includes a step SX for forming a stress buffer layer on bottom walls of the grooves. The step SX proceeds after the step S1 and before the step S2.

Similarly, if the non-active area includes a buffer strip formed in the groove and configured to fill the space on the both sides of the peripheral metal wiring in the groove, the method for manufacturing the non-active area of the array substrate also includes a step SY for forming a buffer strip on the both sides of the peripheral metal wiring in the groove. The step SY proceeds after the step S2.

According to the array substrate, since the inorganic film layer is etched away in the non-active area, the breakage of the peripheral metal wiring due to the breakage of the inorganic film layer during bending is avoided. Furthermore, the surface of the flexible substrate is provided with the grooves, and the peripheral metal wiring is located in the grooves, such that the thickness of the flexible substrate at the peripheral metal wiring is thinned to reduce the squeezing of the peripheral metal wiring by the flexible substrate during a bending process. On the other hand, the configuration of the groove can also release the stress of the flexible substrate during bending, thereby effectively preventing the breakage of the peripheral metal wiring, to improve reliability of the array substrate.

All of the technical features in the embodiments can be employed in arbitrary combinations. For purpose of simplifying the description, not all arbitrary combinations of the technical features in the embodiments illustrated above are described. However, as long as such combinations of the technical features are not contradictory, they should be considered as within the scope of the disclosure in the specification.

The invention claimed is:

1. An array substrate, comprising:
   an active area; and
   a non-active area located outside the active area;
   wherein the non-active area comprises:
   a flexible substrate having a surface, wherein the flexible substrate is provided with a plurality of grooves, and
   a peripheral metal wiring being located in the plurality of grooves,
   wherein: a width of the peripheral metal wiring is less than a width of the groove, the peripheral metal wiring is located at an intermediate position of the groove, the non-active area further comprises a buffer strip formed in the groove, and the buffer strip fills between both sides of the peripheral metal wiring and the groove, along a width direction,
   wherein the non-active area further comprises a stress buffer layer formed between bottom walls of the grooves and the peripheral metal wiring, wherein the stress buffer layer is provided with a plurality of through holes.

2. The array substrate of claim 1, wherein depths of the plurality of grooves are different from each other.

3. The array substrate of claim 1, wherein the non-active area further comprises an encapsulation layer formed on a surface of the flexible substrate proximate to the peripheral metal wiring.

4. The array substrate of claim 1, wherein the flexible substrate comprises a flexible substrate main layer, and a flexible substrate surface layer is formed on a surface of the flexible substrate main layer adjacent to the peripheral metal wiring.

5. The array substrate of claim 4, wherein the flexible substrate main layer comprises at least one flexible substrate layer, and the flexible substrate surface layer comprises at least one flexible substrate layer.

6. The array substrate of claim 4, wherein the flexible substrate surface layer is a patterned flexible substrate surface layer; and hollow regions of the flexible substrate surface layer and the flexible substrate main layer form the grooves.

7. The array substrate of claim 4, wherein a thickness of the flexible substrate surface layer is equal to a depth of the groove.

8. The array substrate of claim 1, wherein the plurality of grooves is arranged in a grid shape.

9. A display screen, comprising the array substrate of claim 1.

10. The array substrate of claim 1, wherein the flexible substrate comprises a plurality of stacked flexible substrate layers.

11. The array substrate of claim 1, wherein a cross section of each of the plurality of grooves comprises a trapezoid.

12. A method for manufacturing an array substrate comprising an active area and a non-active area, comprising manufacturing the non-active area of the array substrate,
wherein the manufacturing the non-active area of the array substrate comprises:
providing a flexible substrate;
forming a plurality of grooves on a surface of the flexible substrate;
forming a stress buffer layer on bottom walls of the plurality of grooves;
forming a plurality of through holes in the stress buffer layer within the grooves;
forming a peripheral metal wiring in the plurality of grooves, and
forming a buffer strip on both sides of the peripheral metal wiring in the plurality of grooves.

13. The method of claim 12, wherein the forming the plurality of grooves on the surface of the flexible substrate comprises:
providing a flexible substrate main layer; and
forming a patterned flexible substrate surface layer on the flexible substrate main layer, hollow regions of the flexible substrate surface layer and the flexible substrate main layer forming the grooves.

14. The method of claim 13, wherein the forming the patterned flexible substrate surface layer on the flexible substrate main layer comprises:
forming the patterned flexible substrate surface layer on the flexible substrate main layer by means of a mask.

* * * * *